US010266942B2

(12) United States Patent
Liu et al.

(10) Patent No.: US 10,266,942 B2
(45) Date of Patent: Apr. 23, 2019

(54) METHOD FOR MAKING ARTIFICIAL GRAPHITE

(71) Applicants: Tsinghua University, Beijing (CN); HON HAI PRECISION INDUSTRY CO., LTD., New Taipei (TW)

(72) Inventors: Peng Liu, Beijing (CN); Wei Zhao, Beijing (CN); Jiang-Tao Wang, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/683,910

(22) Filed: Aug. 23, 2017

(65) Prior Publication Data

US 2018/0148831 A1 May 31, 2018

(30) Foreign Application Priority Data

Nov. 30, 2016 (CN) .......................... 2016 1 1089736

(51) Int. Cl.

| | |
|---|---|
| ***C23C 16/26*** | (2006.01) |
| ***C01B 32/205*** | (2017.01) |
| ***C01B 32/194*** | (2017.01) |
| ***C01B 32/186*** | (2017.01) |
| ***C23C 16/46*** | (2006.01) |

(Continued)

(52) U.S. Cl.

CPC ............ *C23C 16/26* (2013.01); *C01B 32/186* (2017.08); *C01B 32/194* (2017.08); *C01B 32/205* (2017.08); *C23C 16/46* (2013.01); *B82Y 30/00* (2013.01); *B82Y 40/00* (2013.01); *Y10S 977/734* (2013.01); *Y10S 977/843* (2013.01)

(58) Field of Classification Search

CPC ...... C23C 16/26; B05D 3/0254; B05D 3/0433

See application file for complete search history.

(56) References Cited

U.S. PATENT DOCUMENTS

| | | | | |
|---|---|---|---|---|
| 2012/0082787 A1* | 4/2012 | Fujita | B82Y 30/00 | 427/228 |
| 2012/0298623 A1* | 11/2012 | Jiang | H04R 23/002 | 216/33 |

(Continued)

OTHER PUBLICATIONS

Park, Hye Jin, et al., "Growth and properties of few-layer graphene prepared by chemical vapor deposition". Carbon 48 (2010) 1088-1094.*

(Continued)

*Primary Examiner* — Bret P Chen

(74) *Attorney, Agent, or Firm* — ScienBiziP, P.C.

(57) ABSTRACT

A method for making artificial graphite includes placing a graphene film on a surface of a base, to obtain a graphene film/base composite structure. The graphene film includes a first surface and a second surface opposite to the first surface, and the second surface is in direct contact with the surface of the base. The graphene film/base composite structure is placed in a reaction chamber, and a carbon layer is formed on the first surface of the graphene film, to obtain a carbon layer/graphene film/base composite structure. The carbon layer/graphene film/base composite structure is graphitized in an inert gas environment or a vacuum environment to obtain artificial graphite.

20 Claims, 8 Drawing Sheets

(51) Int. Cl.
*B82Y 30/00* (2011.01)
*B82Y 40/00* (2011.01)

(56) References Cited

U.S. PATENT DOCUMENTS

| | | | | |
|---|---|---|---|---|
| 2013/0040204 | A1* | 2/2013 | Liu | H01M 4/366 429/231.95 |
| 2013/0277573 | A1* | 10/2013 | Miller | H01J 37/20 250/440.11 |
| 2015/0266258 | A1* | 9/2015 | Vlassiouk | B32B 1/00 428/408 |
| 2016/0028069 | A1* | 1/2016 | Jiang | H01M 4/133 429/231.8 |
| 2016/0093806 | A1* | 3/2016 | Turchanin | H01L 51/0045 257/27 |

OTHER PUBLICATIONS

Wu, Gang-Ping, et al., "Carbon layer structures and thermal conductivity of graphitized carbon fibers". J. Mater. Sci. (2012) 47:2882-2890.*

Fujita, Jun-ichi, et al., "Graphitization at interface between amorphous carbon and liquid gallium for fabricating large area graphene sheets". J. Vac. Sci. Technol. B 27(6), Nov./Dec. 2009, pp. 3063-3066.*

Jiao, Xuan, et al., "Comparison of the characteristic properties of reduced graphene oxides synthesized from natural graphites with different graphitization degrees". RSC Adv., Jul. 2017, 52337-52344.*

* cited by examiner

METHOD FOR MAKING ARTIFICIAL GRAPHITE

CROSS-REFERENCE TO RELATED APPLICATIONS

This application claims all benefits accruing under 35 U.S.C. § 119 from China Patent Application No. 201611089736.6, filed on Nov. 30, 2016, in the China Intellectual Property Office, the disclosure of which is incorporated herein by reference.

FIELD

The present application relates to a method for making artificial graphite.

BACKGROUND

A method for making an artificial graphite includes mixing a graphite, a coating material, and a solvent. Then the solvent is removed to form a composite material. Finally, the composite material is carbonized and graphitized. Thus, the artificial graphite is created. However, a size of the artificial graphite is very small. It is difficult to create a larger size artificial graphite.

What is needed, therefore, is to provide a method for making artificial graphite that can overcome the above-described shortcomings.

BRIEF DESCRIPTION OF THE DRAWINGS

Implementations of the present technology will now be described, by way of example only, with reference to the attached figures, wherein.

DETAILED DESCRIPTION

Figure 1:
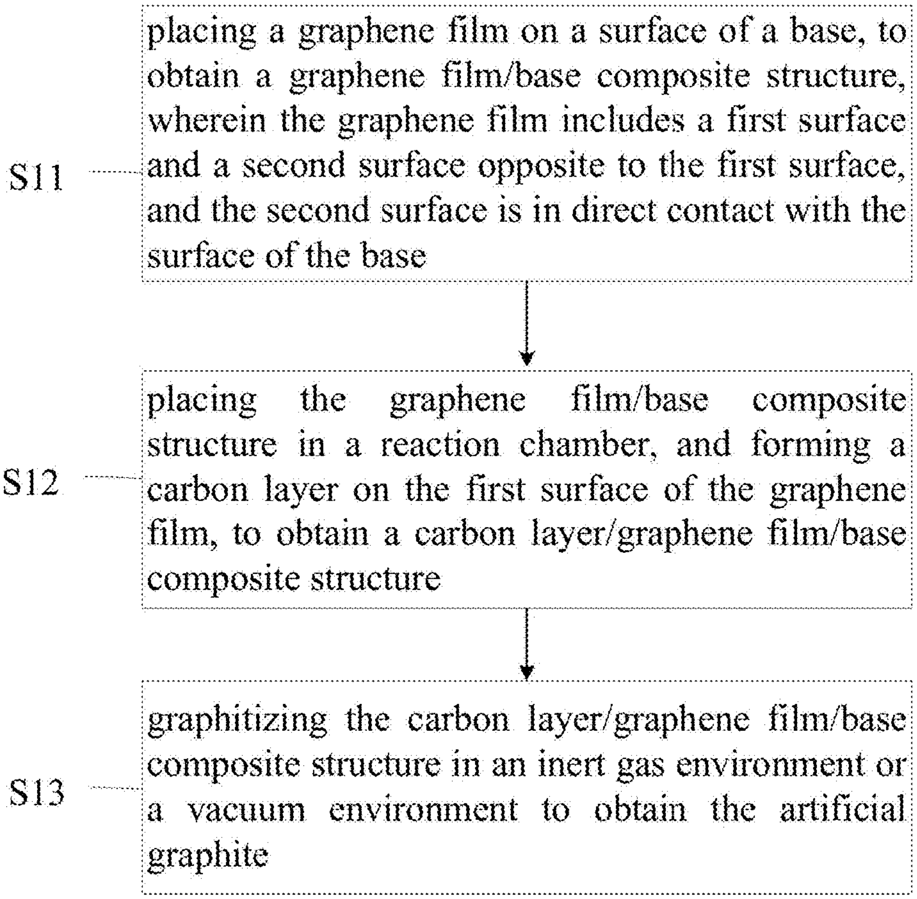
FIG. 1 is a process flow of one embodiment of a method for making an artificial graphite.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated to illustrate details and features better. The description is not to be considered as limiting the scope of the embodiments described herein.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Referring to FIG. 1, a method for making an artificial graphite of one embodiment may include the following steps:

S11, placing a graphene film on a surface of a base, to obtain a graphene film/base composite structure, wherein the graphene film includes a first surface and a second surface opposite to the first surface, and the second surface is in direct contact with the surface of the base;

S12, placing the graphene film/base composite structure in a reaction chamber, and forming a carbon layer on the first surface of the graphene film, to obtain a carbon layer/graphene film/base composite structure;

S13, graphitizing the carbon layer/graphene film/base composite structure in an inert gas environment or a vacuum environment to obtain the artificial graphite.

In the step S11, the method for making the graphene film is not limited. In one embodiment, the method for making the graphene film may include the following steps:

S111, providing a metal substrate including a first metal surface and a second metal surface opposite to the first metal surface;

S112, growing the graphene film on the first metal surface of the metal substrate by a chemical vapor deposition (CVD) method;

S113, removing the metal substrate.

In the step S111, the metal substrate can be a metal foil with a thickness in a range of about 100 nanometers to about 100 micrometers. A material of the metal substrate can be copper or nickel. A shape of the metal substrate is not limited. An area of the metal substrate can be selected according to the volume of a chamber used to grow the graphene film by the CVD method. The metal substrate can be rolled up and put into the chamber to grow the graphene film with a large area. In one embodiment, the metal substrate is a copper foil with a thickness of about 25 micrometers.

The step S112 includes the steps of:

S1120, disposing the metal substrate in the chamber;

S1121, heating the metal substrate to a predetermined temperature; and

S1122, supplying the carbon source gas into the chamber, thereby forming the graphene film on the first metal surface of the metal substrate.

In step S1120, the chamber can provide a reaction space for forming the graphene film. The chamber can have a sealed cavity. The chamber includes a gas inlet and a gas outlet. The gas inlet is used to input a reaction gas or other resource gas. The gas outlet is connected with an evacuating device. The evacuating device can be used to adjust the pressure in the reacting chamber. Furthermore, the chamber can include a water cooling device to adjust the temperature in the chamber. The chamber can be a quartz tube furnace. An area of the metal substrate can be adjusted according to the volume of the chamber. The metal substrate with a relatively large area can be bent or curved so that it can be placed in the chamber.

In step S1121, the first metal surface of the metal substrate is heated to become more flat. The flatter the first metal surface, the easier to form the graphene film on the first metal surface of the metal substrate. The chamber is evacuated before heating the metal substrate. In one embodiment, hydrogen gas can be imported in the chamber through the gas inlet before heating the metal substrate. The hydrogen gas can reduce an oxide layer on the first metal surface of the metal substrate, and can further prevent the metal substrate from oxidizing. A flow rate of the hydrogen gas can be in a range of about 2 standard cubic centimeters per minute (sccm) to about 35 sccm. A heating temperature can be in a range of about 800° C. to about 1500° C. A heating period can be in a range of about 20 minutes to about 60 minutes. A pressure in the chamber can be in a range of about 0.1 Pa to about 100 Pa. In one embodiment, the flow rate of the hydrogen gas is about 2 sccm, the pressure of the chamber is about 13.3 Pa, the heating temperature is about 1000° C., the temperature rising period is about 40 minutes, and the constant temperature period at the heating temperature is about 20 minutes.

In step S1122, carbon atoms can be deposited on the first metal surface of the metal substrate, thereby forming the graphene film composed of carbon atoms. The hydrogen gas is continuously imported through the gas inlet in step S1122 during the process of growing the graphene film. The flow rate of the hydrogen gas, during supplying the carbon source gas into the chamber, is the same as that of the step S1121. A ratio between the flow rate of the carbon source gas and the hydrogen gas is in a range of about 45:2 to about 15:2. The carbon source gas can be at least one of methane, ethane, ethylene, or acetylene. While supplying the carbon source gas, the temperature in the chamber can be in a range of about 800° C. to about 1500° C. with a constant temperature period in a range of about 10 minutes to about 60 minutes. A pressure in the chamber can be in a range of about $10^{-1}$ Pa to about $10^{2}$ Pa. In one embodiment, the pressure of the chamber is about 66.5 Pa, the temperature of the chamber is about 1000° C., the flow rate of the carbon source gas is about 25 sccm, the carbon gas is methane, and the constant temperature period is about 30 minutes.

In step S1122, the metal substrate can be cooled after forming the graphene film thereon. While cooling the metal substrate, the carbon source gas and the hydrogen gas can be continuously flowed into the chamber. The flow rate of the carbon source gas and the hydrogen gas and the pressure of the chamber are constant. In one embodiment, the metal substrate is cooled for about 1 hour. After cooling the metal substrate, the metal substrate with the graphene film grown thereon is taken out of the chamber.

The graphene film is a two dimensional film structure. A thickness of the graphene film can be in a range of about 0.34 nanometers to about 10 nanometers. The graphene film is a single atomic sheet composed of a plurality of $sp^2$-bonded carbon atoms. The graphene film is not an absolutely smooth two-dimensional film, but a large number of microscopic peaks and valleys on the surface of the graphene film. The graphene film is in this way to maintain its own self-support and stability. Thus, the graphene film can be a free-standing structure. The term "free-standing structure" means that the graphene film can sustain the weight of itself when it is hoisted by a portion thereof without any significant damage to its structural integrity. So, if the graphene film is placed between two separate supports, a portion of the graphene film not in contact with the two supports, would be suspended between the two supports and yet maintain structural integrity.

In the step S113, the method for removing the metal substrate is not limited, such as peeling by a knife or a tape, or etching. In one embodiment, the metal substrate is etched by wet etching technology, and the material of the metal substrate is copper. The metal substrate is etched by immersing the metal substrate in a. Ferric trichloride ($FeCl_3$) solution, wherein a concentration of the $FeCl_3$ solution is in a range of about 0.06 mol/L to about 0.25 mol/L, the immersing period is in a range of about 4 minutes to about 15 minutes. The metal substrate is removed due to a chemical reaction between the metal substrate and the $FeCl_3$ solution.

In the step S11, in order to protect the base from destruction, the melting point of the base is greater than 3000 degrees Celsius in the inert gas environment or the vacuum environment. The material of the base can be carbon nanotube or boron nitride. In one embodiment, the base is a carbon nanotube film.

The carbon nanotube film includes a plurality of carbon nanotubes. The plurality of carbon nanotubes may be single-walled, double-walled, multi-walled carbon nanotubes, or their combinations. The carbon nanotubes which are single-walled have a diameter of about 0.5 nanometers (nm) to about 50 nm. The carbon nanotubes which are double-walled have a diameter of about 1.0 nm to about 50 nm. The carbon nanotubes which are multi-walled have a diameter of about 1.5 nm to about 50 nm.

The plurality of carbon nanotubes can be orderly or disorderly arranged. The term 'disordered carbon nanotube' refers to the carbon nanotubes extend along many different directions, and the extending directions of the carbon nanotubes are random. The carbon nanotubes can be entangled with each other.

The term 'ordered carbon nanotube' refers to the carbon nanotubes extend in a consistently systematic manner, e.g., the carbon nanotubes extend approximately along a same direction and/or have two or more sections within each of which the carbon nanotubes are arranged approximately along a same direction (different sections can have different directions).

The carbon nanotube film can be a drawn carbon nanotube film, a flocculated carbon nanotube film, or a pressed carbon nanotube film. In one embodiment, the base is one drawn carbon nanotube film.

Figure 2:
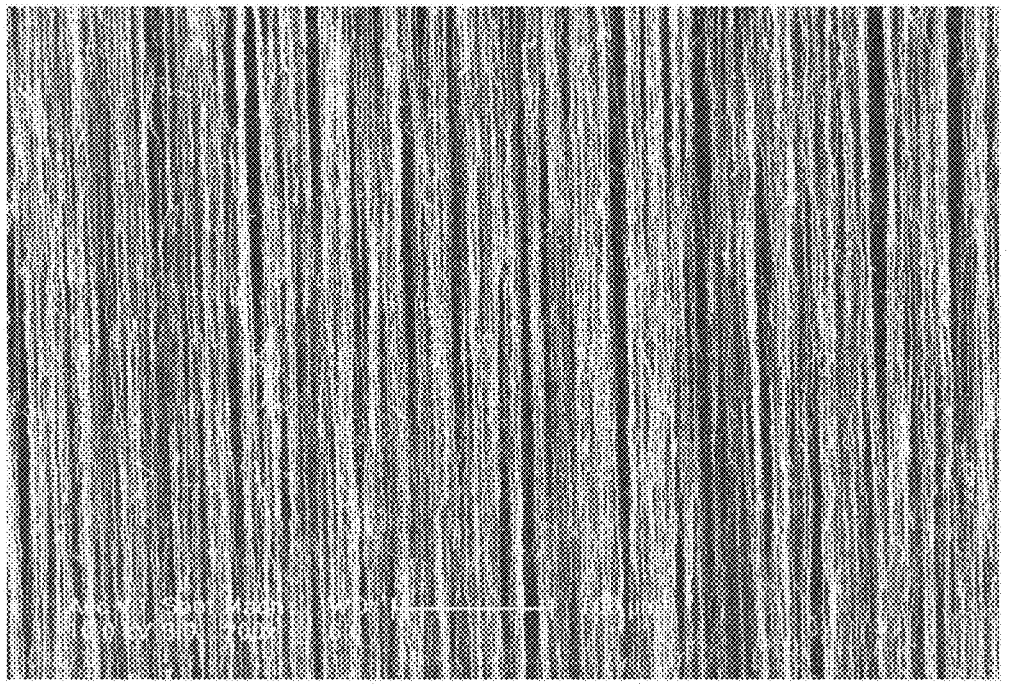
FIG. 2 is a scanning electron microscope (SEM) image of a drawn carbon nanotube film.

Referring to FIG. 2, the drawn carbon nanotube film comprises a plurality of successive and oriented carbon nanotubes joined end-to-end by van der Waals attractive force therebetween. The carbon nanotubes in the drawn carbon nanotube film extend along the same direction. The carbon nanotubes are parallel to a surface of the drawn carbon nanotube film. The drawn carbon nanotube film is a free-standing film. The drawn carbon nanotube film can bend to desired shapes without breaking.

If the base includes at least two stacked drawn carbon nanotube films, adjacent drawn carbon nanotube films can be combined by only the van der Waals attractive force therebetween. Additionally, when the carbon nanotubes in the drawn carbon nanotube film are aligned along one preferred orientation, an angle can exist between the orientations of carbon nanotubes in adjacent drawn carbon nanotube films, whether stacked or adjacent. An angle between the aligned directions of the carbon nanotubes in two adjacent drawn carbon nanotube films can be in a range of about 0 degrees to about 90 degrees.

Figure 3:
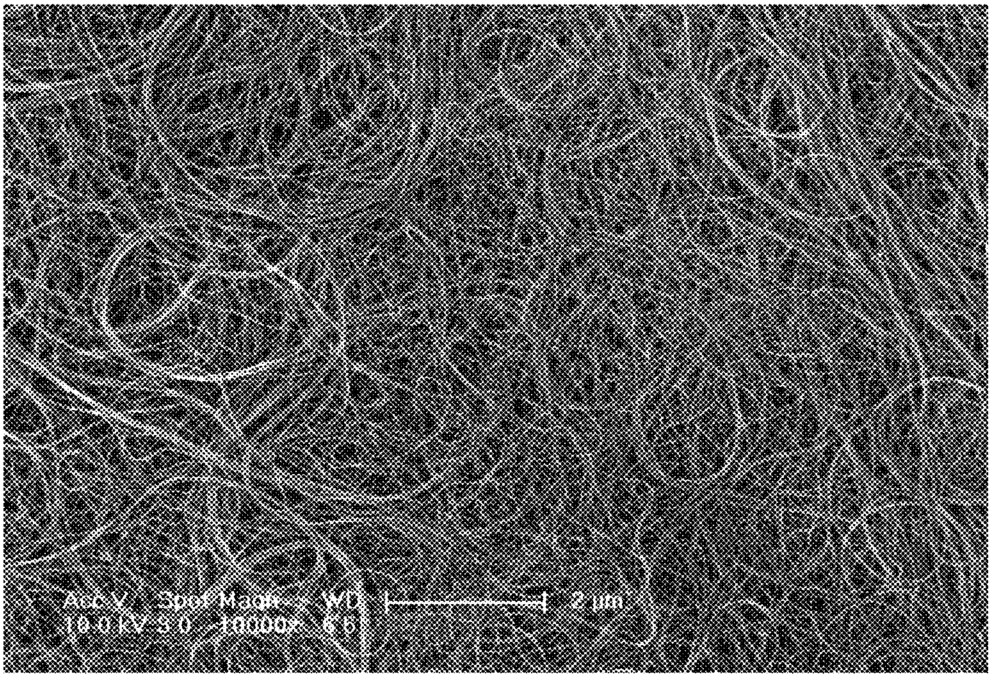
FIG. 3 is an SEM image of a flocculated carbon nanotube film.

Referring to FIG. 3, the flocculated carbon nanotube film comprises a plurality of long, curved, disordered carbon nanotubes entangled with each other. The flocculated carbon nanotube film can be isotropic. The carbon nanotubes can be substantially uniformly dispersed in the flocculated carbon nanotube film. Adjacent carbon nanotubes are acting upon by van der Waals attractive force to obtain an entangled structure. Due to the carbon nanotubes in the flocculated carbon nanotube film being entangled with each other, the flocculated carbon nanotube film has excellent durability and can be fashioned into desired shapes with a low risk to the integrity of the flocculated carbon nanotube film. Further, the flocculated carbon nanotube film is a free-standing film.

Figure 4:
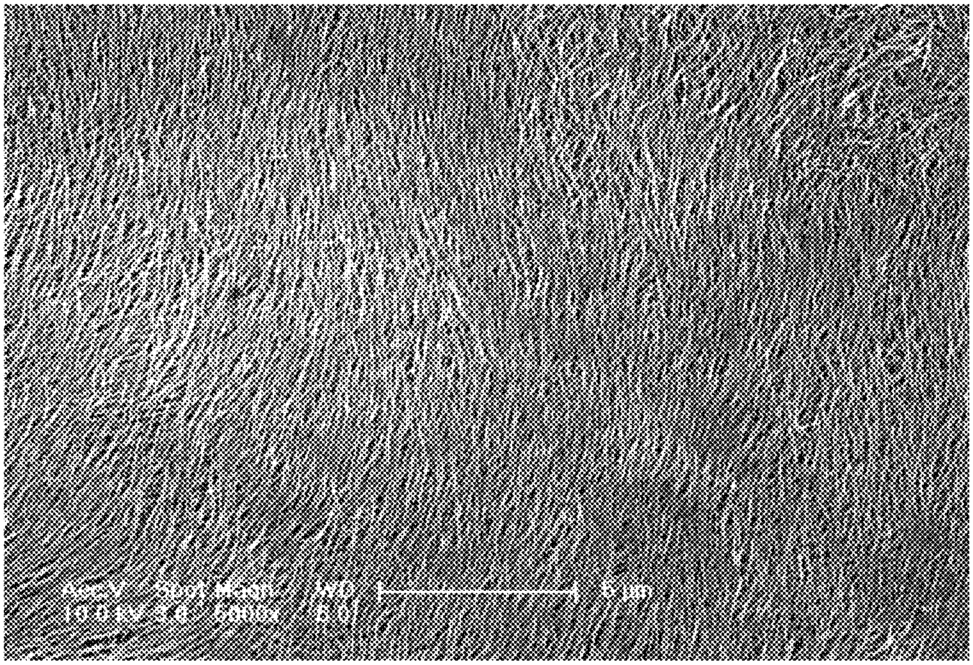
FIG. 4 is an SEM image of a pressed carbon nanotube film including a plurality of carbon nanotubes arranged along the same direction.
Figure 5:
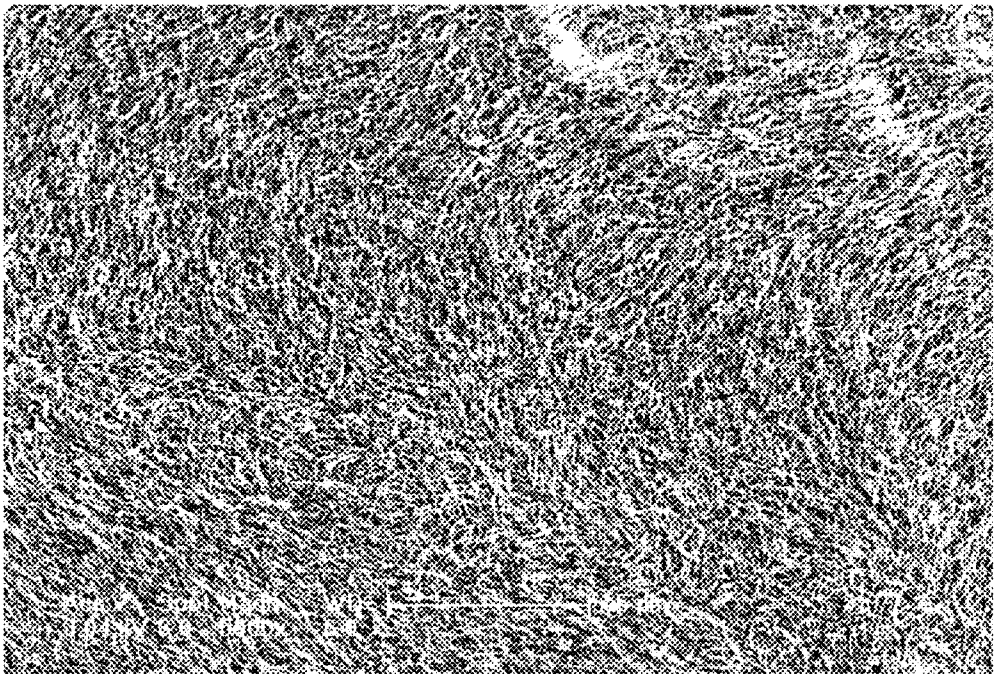
FIG. 5 is an SEM image of a pressed carbon nanotube film including a plurality of carbon nanotubes arranged along different directions.

Referring to FIGS. 4 and 5, the pressed carbon nanotube film comprises a plurality of carbon nanotubes. The carbon nanotubes in the pressed carbon nanotube film can extend along the same direction, as shown in FIG. 4. The carbon nanotubes in the pressed carbon nanotube film can extend along different directions, as shown in FIG. 5. The carbon nanotubes in the pressed carbon nanotube film can rest upon each other. An angle between a primary alignment direction of the carbon nanotubes and a surface of the pressed carbon nanotube film is about 0 degrees to approximately 15 degrees. The greater the pressure applied, the smaller the angle obtained. If the carbon nanotubes in the pressed carbon nanotube film extend along different directions, the pressed carbon nanotube film can have properties that are identical in all directions substantially parallel to the surface of the pressed carbon nanotube film. Adjacent carbon nanotubes are attracting to each other and are joined by van der Waals attractive force. Therefore, the pressed carbon nanotube film is easy to bend to desired shapes without breaking. Further, the pressed carbon nanotube film is a free-standing film.

The term "free-standing" comprises, but not limited to, the carbon nanotube film that does not have to be supported by a substrate. For example, the free-standing carbon nanotube film can sustain the weight of itself when it is hoisted by a portion thereof without any significant damage to its structural integrity. So, if the free-standing carbon nanotube film is placed between two separate supporters, a portion of the free-standing carbon nanotube film, not in contact with the two supporters, would be suspended between the two supporters and yet maintain film structural integrity.

In the step S12, forming the carbon layer may include the following steps:

S121, supplying a carrier gas to the reaction chamber;

S122, supplying a carbon source gas to the reaction chamber; and

S123, heating the reaction chamber to a temperature of about 900 degrees Celsius to about 1800 degrees Celsius, cracking the carbon source gas to form <indefinite> carbon free radicals, wherein the carbon free radicals are deposited on the first surface of the graphene film to form the carbon layer.

In the step S121, the reaction chamber can be purified by the carrier gas so that the reaction chamber has a clean environment. The carrier gas includes nitrogen, ammonia, or inert gas, such as argon. A flow speed of the carrier gas can range of about 50 sccm to about 100 sccm. The step 121 can be omitted. When the step 121 is omitted, there is no oxygen and water vapor in the reaction chamber, and the carbon source gas is relatively pure, so that the carbon nanotube film acting as the base does not burn at the temperature of about 900 degrees Celsius to about 1800 degrees Celsius.

In the step S122, the carbon source gas can be a hydrocarbon compound, such as alkyne. A flow speed of the carbon source gas can range of about 20 sccm to about 100 sccm.

In the step S123, the thickness of the carbon layer is related to the time of depositing the carbon free radicals. The longer the time of depositing the carbon free radicals, the thicker the thickness of the carbon layer. In one embodiment, when the time of depositing the carbon free radicals ranges of about 1 minute to about 60 minutes, a thickness of the carbon layer ranges of about 5 nanometers to about 10 micrometers. In order to uniformly cover the graphene film, the thickness of the carbon layer is greater than or equal to 5 nanometers.

In the process of forming the carbon layer, the reaction chamber can have different pressures. In one embodiment, the pressure may be atmospheric. In another embodiment, the pressure in the reaction chamber can be in a range of about 50 Pa to about 1000 Pa. The carbon nanotube film acting as the base cannot be destroyed at the temperature of the reaction chamber, because the inert gas is in the reaction chamber and the pressure in the reaction chamber ranges of about 50 Pa to about 1000 Pa. In one embodiment, there is atmospheric pressure in the reaction chamber.

The carrier gas and the carbon source gas can be simultaneously supplied to the reaction chamber. At this time, the flow speed of the carrier gas ranges of about 10 sccm to about 50 sccm. In one embodiment, the carrier gas and the carbon source gas are simultaneously supplied to the reaction chamber, the flow speed of the carrier gas is about 25 sccm, and the flow speed of the carbon source gas is about 50 sccm.

In the step S13, the temperature of graphitizing the carbon layer/graphene film/base composite structure can be in a range of about 2600 degrees Celsius to about 3000 degrees Celsius. The time of graphitizing the carbon layer/graphene film/base composite structure can be in a range of about 0.5 hours to about 1 hour.

In the process of graphitizing the carbon layer/graphene film/base composite structure, the carbon layer is graphitized to form a graphite layer on the first surface of the graphene film. The graphite layer and the graphene film form a graphite structure. A covalent bond can be formed between the graphene film and the base in the process of graphitizing the carbon layer/graphene film/base composite structure. After graphitizing the carbon layer/graphene film/base composite structure, it is difficult to separate the base and the graphene film, because a covalent bond is formed between the graphene film and the base. Thus, the graphite structure and the base are firmly bonded to each other, to form the artificial graphite. The artificial graphite includes the graphite structure and the base.

In one embodiment, the base is the carbon nanotube film, a carbon-carbon covalent bond is formed between the carbon nanotube film and the graphene film, so that the graphite structure and the carbon nanotube film are firmly bonded to each other. The carbon nanotubes of the carbon nanotube film are $SP^2$ hybrid graphite layer structure, and the original structure defects of carbon nanotubes can be repaired during heating in the inert gas environment or the vacuum environment. Thus, the carbon nanotube film, the graphene film and the graphite layer can form the artificial graphite.

Figure 6:
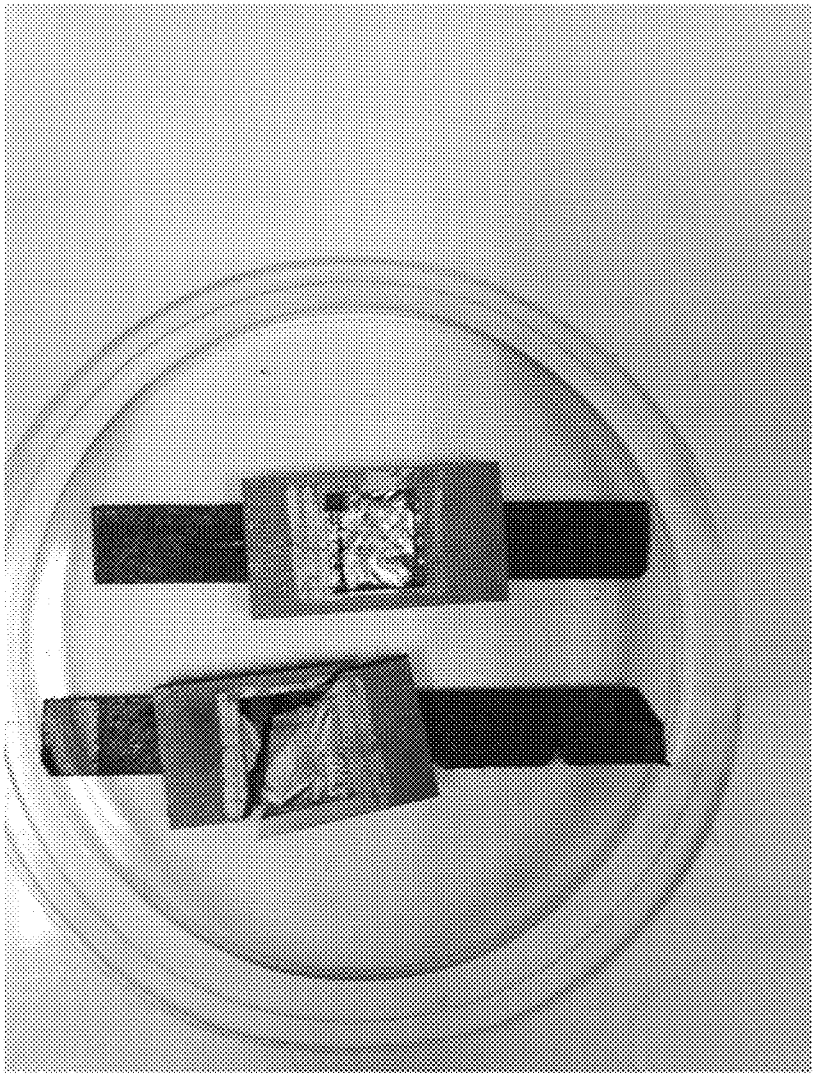
FIG. 6 is an optical photograph of an artificial graphite that is prepared by the method of FIG. 1.
Figure 7:
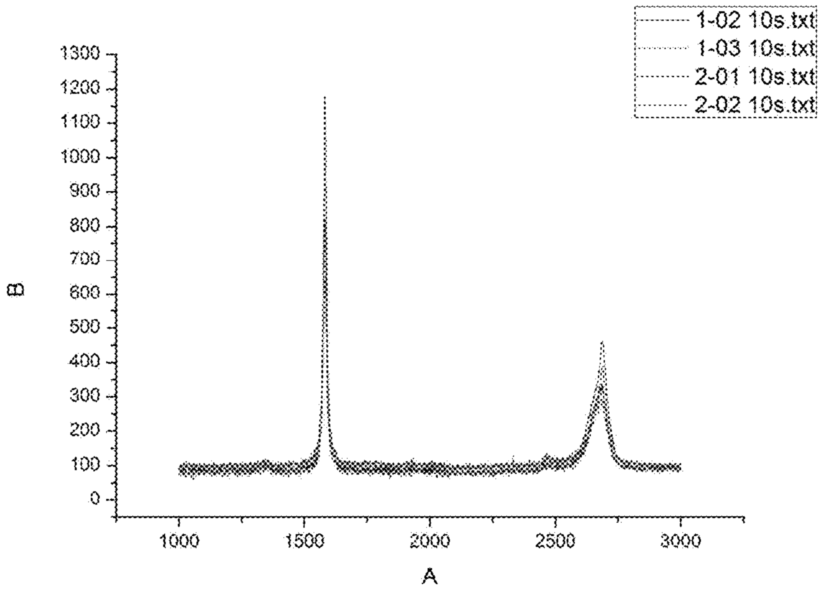
FIG. 7 is a Raman spectrum of an artificial graphite that is prepared by the method of FIG. 1.

The graphite structure includes a plurality of lamellar structure stacked with each other. Each lamellar structure includes a plurality of reticular structures that are connected to each other by van der Waals forces. The adjacent three carbon atoms form three covalent single bonds in $SP^2$ hybrid orbital, and are arranged in a planar hexagonal, to form each reticular structure. FIG. 6 is an optical photograph of the artificial graphite. FIG. 7 is a Raman spectrum of the final product prepared by the method of FIG. 1. The Raman spectrum is consistent with the Raman spectra of a graphite, thus it can be determined that the final product prepared by the method of FIG. 1 is artificial graphite.

Figure 8:
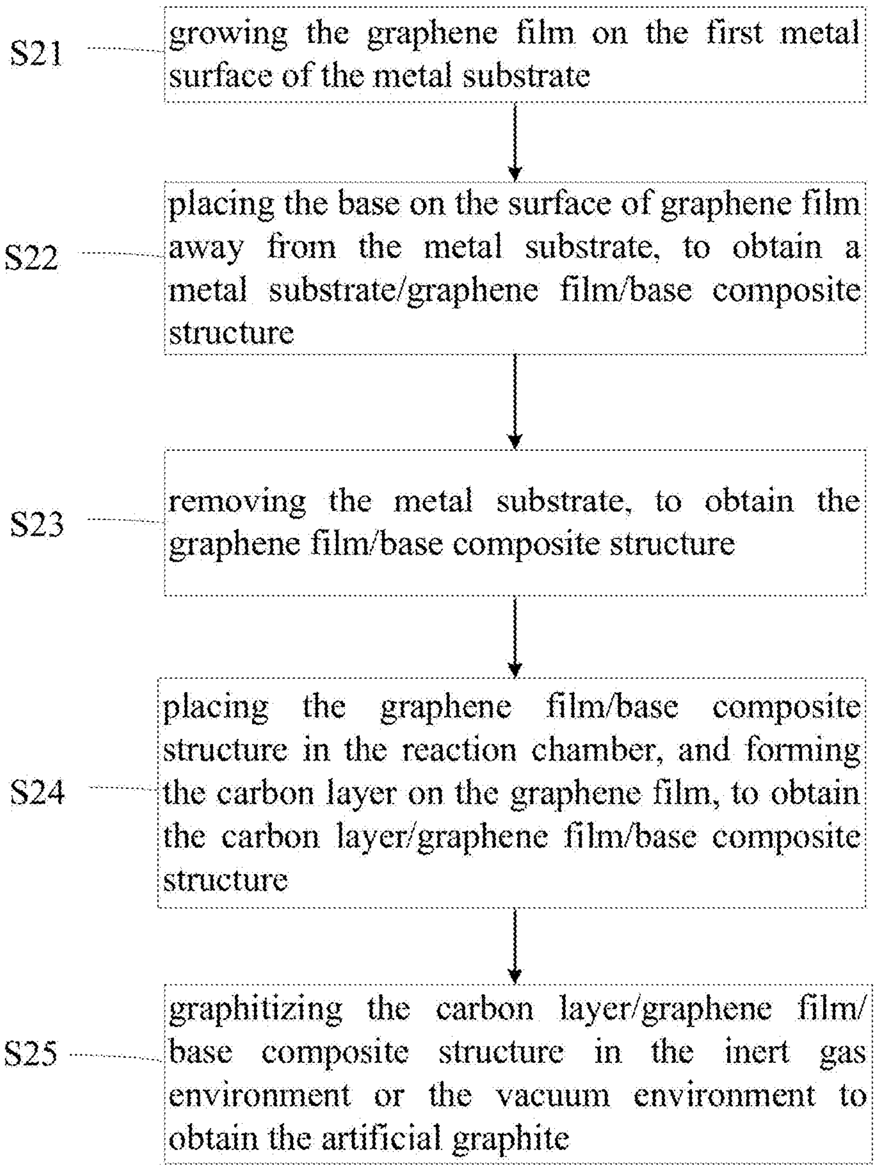
FIG. 8 is a process flow of another embodiment of a method for making an artificial graphite.

Referring to FIG. 8, an embodiment of the method for making the artificial graphite is shown where after stacking the graphene film and the base, the metal substrate is removed. In this embodiment, the method for making the artificial graphite of another embodiment may include the following steps:

S21, growing the graphene film on the first metal surface of the metal substrate;

S22, placing the base on the surface of graphene film that is spaced from the metal substrate, to obtain a metal substrate/graphene film/base composite structure;

S23, removing the metal substrate, to obtain the graphene film/base composite structure;

S24, placing the graphene film/base composite structure in the reaction chamber, and forming the carbon layer on the graphene film, to obtain the carbon layer/graphene film/base composite structure;

S25, graphitizing the carbon layer/graphene film/base composite structure in the inert gas environment or the vacuum environment to obtain the artificial graphite.

In the step S22, after placing the base on the surface of graphene film, the metal substrate/graphene film/base composite structure can be further pressed using a force to closely combine the base and the graphene film. Before placing the base on the surface of graphene film, an organic solvent can be dropped on the surface of graphene film that is spaced from the metal substrate, so that the base can be closely combined with the graphene film by volatilization of the organic solvent.

In the step S23, the metal substrate can be removed by a solution erosion technology. The solution can be selected according to the material of the metal substrate. In one embodiment, the material of the metal substrate is copper, the solution is $FeCl_3$ solution. The metal substrate/graphene film/base composite structure is immersed into $FeCl_3$ solution, thereby causing a reaction between the copper and the $FeCl_3$ solution. The copper is completely removed due to the reaction, and the graphene film/base composite structure is formed. The solution erosion technology is simple and easy to operate. The graphene film/base composite structure can be taken out from the remaining solution. The base can support the graphene film. Thus, the graphene film is not easily broken due to a gravity of the remaining solution when taking the graphene film/base composite structure out from the remaining solution. Furthermore, the remaining solution can be removed after the reaction has completed.

In one embodiment, the remaining solution is removed by the supercritical carbon dioxide method, by which destruction of the graphene film due to surface tension of the remaining solution can be avoided. The supercritical carbon dioxide method includes: disposing the graphene film/base composite structure infiltrated by the remaining solution into a sealing device, wherein the sealing device has an inlet and an outlet; gradually sucking out the remaining solution from the outlet while importing a liquid carbon dioxide into the sealing device from the inlet, wherein a temperature and a pressure of the sealing device need to be adjusted so that the liquid carbon dioxide exists in the supercritical state; and removing the liquid carbon dioxide from the sealing device after the remaining solution has been completely removed. In one embodiment, the temperature of the sealing device is about 35° C., and the pressure of the sealing device is about 9 Mpa.

Subsequently, the graphene film/base composite structure can be repeatedly washed with deionized water. In one embodiment, the graphene film/base composite structure can be washed with deionized water for 15 minutes, using 300 mL of deionized water.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

Additionally, it is also to be understood that the above description and the claims drawn to a method may comprise some indication in reference to certain steps. However, the indication used is only to be viewed for identification purposes and not as a suggestion as to an order for the steps.

What is claimed is:

1. A method for making artificial graphite, comprising:

placing a graphene film on a surface of a base, to obtain a graphene film/base composite structure, wherein the graphene film comprises a first surface and a second surface opposite to the first surface, and the second surface is in direct contact with the surface of the base;

placing the graphene film/base composite structure in a reaction chamber to form a carbon layer on the first surface of the graphene film, and to obtain a carbon layer/graphene film/base composite structure; and graphitizing the carbon layer/graphene film/base composite structure in an inert gas environment or a vacuum environment to obtain artificial graphite.

2. The method of claim 1, wherein a material of the base is carbon nanotube or boron nitride.

3. The method of claim 1, wherein the base comprises a plurality of carbon nanotubes joined end-to-end by van der Waals attractive force and extending along the same direction.

4. The method of claim 1, wherein the base comprises a plurality of carbon nanotubes entangled with each other.

5. The method of claim 1, wherein the forming the carbon layer comprises:

supplying a carrier gas into the reaction chamber;

supplying a carbon source gas into the reaction chamber; and heating the reaction chamber to a temperature of about 900 degrees Celsius to about 1800 degrees Celsius, cracking the carbon source gas to form a plurality of carbon free radicals, wherein the plurality of carbon free radicals are deposited on the first surface of the graphene film.

6. The method of claim 1, wherein a thickness of the carbon layer is greater than or equal to 5 nanometers.

7. The method of claim 1, wherein the reaction chamber has a pressure in a range of about 50 Pa to about 1000 Pa when forming the carbon layer.

8. The method of claim 1, wherein the reaction chamber has an atmospheric pressure when forming the carbon layer.

9. The method of claim 1, wherein a temperature of graphitizing the carbon layer/graphene film/base composite structure is in a range of about 2600 degrees Celsius to about 3000 degrees Celsius.

10. The method of claim 1, wherein a time of graphitizing the carbon layer/graphene film/base composite structure is in a range of about 0.5 hours to about 1 hour.

11. The method of claim 1, wherein a plurality of covalent bonds is formed between the graphene film and the base when graphitizing the carbon layer/graphene film/base composite structure.

12. A method for making an artificial graphite, comprising:

growing a graphene film on a surface of a metal substrate;

placing a base on the surface of graphene film that is spaced from the metal substrate, to obtain a metal substrate/graphene film/base composite structure;

removing the metal substrate, to obtain a graphene film/base composite structure;

placing the graphene film/base composite structure in a reaction chamber to form a carbon layer on the graphene film, and to obtain a carbon layer/graphene film/base composite structure; and graphitizing the carbon layer/graphene film/base composite structure in an inert gas environment or a vacuum environment to obtain the artificial graphite.

13. The method of claim 12, wherein a material of the base is carbon nanotube or boron nitride.

14. The method of claim 12, wherein the base comprises a plurality of carbon nanotubes joined end-to-end by van der Waals attractive force and extending along a same direction.

15. The method of claim 12, wherein the base comprises a plurality of carbon nanotubes entangled with each other.

16. The method of claim 12, wherein the forming the carbon layer comprises:

supplying a carrier gas to the reaction chamber;

supplying a carbon source gas to the reaction chamber; and heating the reaction chamber to a temperature of about 900 degrees Celsius to about 1800 degrees Celsius, cracking the carbon source gas to form a plurality of carbon free radicals, wherein the plurality of carbon free radicals are deposited on the first surface of the graphene film.

17. The method of claim 12, wherein the metal substrate is removed by solution erosion.

18. The method of claim 12, wherein a material of the metal substrate is copper, and the removing the metal substrate comprises:

placing the metal substrate/graphene film/base composite structure into a Ferric trichloride solution, to form the graphene film/base composite structure and a remaining solution.

19. The method of claim 18, wherein the removing the metal substrate further comprises: after forming the graphene film/base composite structure, taking out the graphene film/base composite structure from the remaining solution.

20. The method of claim 18, wherein the removing the remaining solution further comprises:

after forming the graphene film/base composite structure, disposing the graphene film/base composite structure infiltrated by the remaining solution into a sealing device, wherein the sealing device has an inlet and an outlet;

sucking out the remaining solution from the outlet while importing a liquid carbon dioxide into the sealing device from the inlet, wherein a temperature and a pressure of the sealing device is adjusted so that the liquid carbon dioxide exists in the supercritical state; and removing the liquid carbon dioxide from the sealing device.

* * * * *